United States Patent [19]

Gronner et al.

[11] 3,806,917

[45] Apr. 23, 1974

[54] DIGITAL TO SYNCHRO CONVERTER

[75] Inventors: Alfred D. Gronner, White Plains, N.Y.; David Simon, Paterson, N.J.

[73] Assignee: The Singer Company, Little Falls, N.J.

[22] Filed: Dec. 4, 1972

[21] Appl. No.: 311,792

[52] U.S. Cl. ...................... 340/347 DA, 340/347 SY

[51] Int. Cl. ........................................... H03k 13/04

[58] Field of Search ................ 340/347 DA, 347 SY

[56] References Cited

UNITED STATES PATENTS

| | | | |
|---|---|---|---|
| 3,134,098 | 5/1964 | Herzl | 340/347 DA |
| 3,325,805 | 6/1967 | Dorey | 340/347 DA |
| 3,487,304 | 12/1969 | Kennedy | 340/347 DA X |
| 3,675,234 | 7/1972 | Metz | 340/347 SY |
| 3,223,992 | 12/1965 | Bentley et al. | 340/347 DA |
| 3,241,133 | 3/1966 | Herzl | 340/347 DA |
| 3,335,417 | 8/1967 | Adler et al. | 340/347 SY |

*Primary Examiner*—Charles D. Miller
*Attorney, Agent, or Firm*—T. W. Kennedy

[57] ABSTRACT

A digital to resolver or synchro converter in which a simple ladder network and multiplexing are used to provide highly accurate outputs at a low cost is shown. An N bit digital word representing the angle is stored in a register and N-2 bits of the word and its complement alternately switched to control a simple R, 2R—$2^{N-3}$ R ladder network which in alternate time periods will provide sine and cosine outputs. Further switching logic switches the ladder network output to respective sine or cosine output channels. Each output channel provides a positive or negative output in response to inputs obtained by decoding the first two bits of the digital word. The simple approximation used in the ladder network, although it does not provide absolute sine and cosine accuracy does provide a tangent, the function of practical importance, which has the required accuracy.

11 Claims, 8 Drawing Figures

DIGITAL TO SYNCHRO CONVERTER

BACKGROUND OF THE INVENTION

This invention relates to conversion apparatus in general and more particularly to an improved digital to synchro converter.

Various devices have been developed to convert an output from a digital computer, for example, in binary form into a synchro or resolver signal. For example, see U.S. Pat. Nos. 3,277,464 and 3,071,324. In these prior art converters complex ladder networks are generally required. In addition, separate hardware is generally used in generating the sine and cosine outputs. Thus, a need exists for a converter which will perform an accurate conversion at a low cost.

SUMMARY

The present invention provides a converter which provides high accuracy at low cost. This is done by using a simple ladder network and by multiplexing the sine and cosine outputs. The digital word to be converted is periodically updated and loaded into a buffer register. The word and its complement are alternately provided, in response to control logic, as outputs to control a simple R, 2R, −NR ladder network which has the reference AC voltage as an input. The same logic causes the ladder network output to alternately be provided to a cosine and a sine channel where it is stored and provided as an output. The most significant bits of the digital word are provided to decoding logic which provides output indicative of the sign of the sine and cosine. Inverting amplifiers in each of the sine and cosine channels are responsive to these outputs to provide sine and cosine outputs having the proper sign. The ladder network makes use of an approximation for sine and cosine which is not particularly accurate but results in a tangent, i.e., sine/cosine, which is accurate. Since the type of devices with which the converter is used respond to the tangent rather than the sine or cosine, the converter provides the required output accuracy.

DETAILED DESCRIPTION OF THE PREFERRED EMBODIMENT

Figures 1, 1A, 1B, 4A, 5:
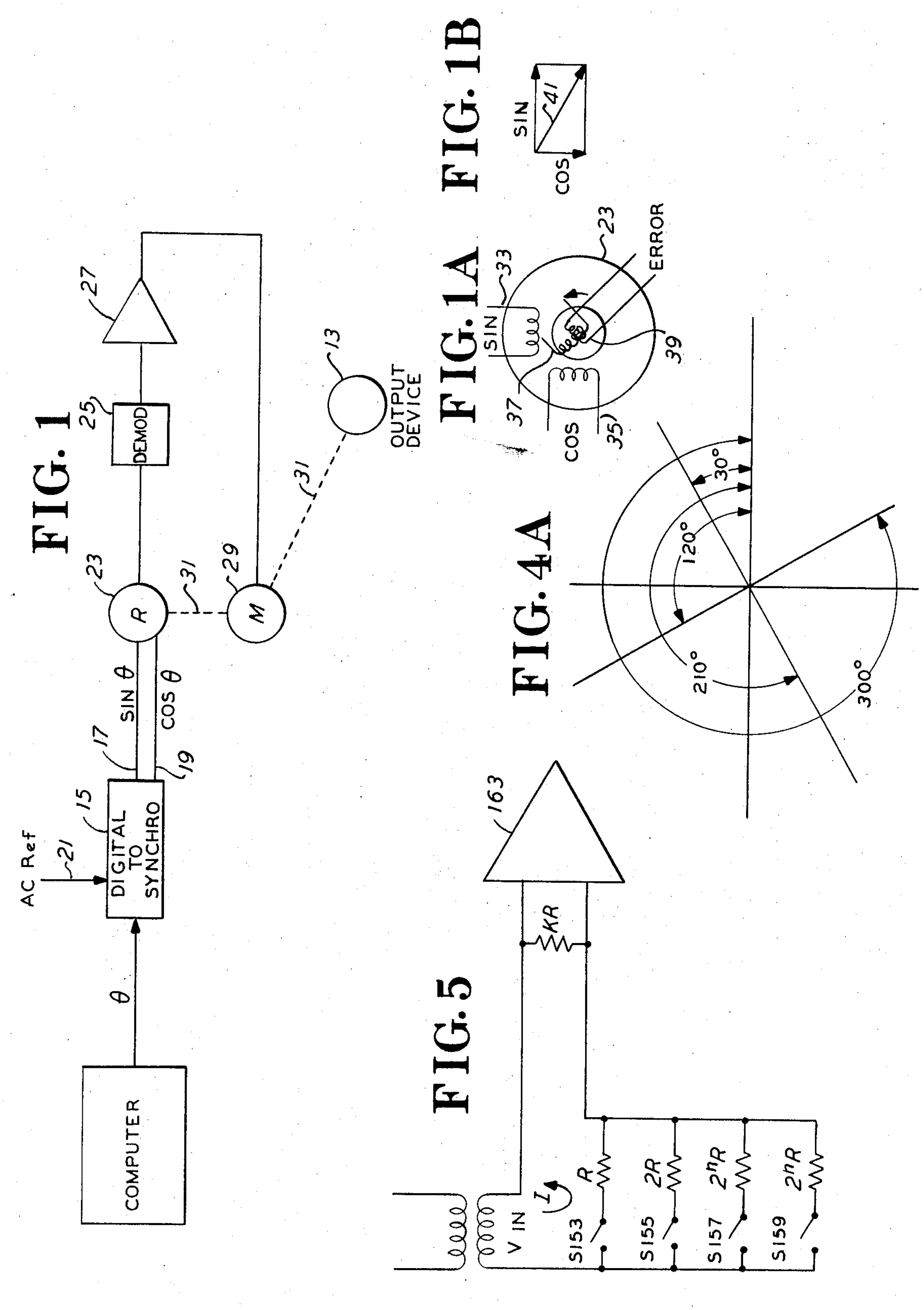
FIG. 1 is a block diagram of a typical system with digital to synchro converter of the present invention installed.
FIG. 1A is a schematic diagram of the resolver of FIG. 1.
FIG. 1B is a vector diagram illustrating the magnetic field in the resolver of FIG. 1A.
FIG. 4A is a diagram illustrating the sine and cosine values in the different quadrants.
FIG. 5 is a simplified schematic of the ladder network of FIG. 3.

FIG. 1 illustrates a typical system in which the digital synchro converter in the present invention may be used and is helpful in understanding the system. In such a system a computer 11 provides an output in binary form representing an angle Theta. This is the angle at which an output device 13 is to be positioned. The digital to synchro converter 15 converts the angle Theta in binary form to two outputs, one representing the sine of Theta on line 17 and the other representing the cosine of Theta on line 19. These are AC signals which are amplitude modulated so that the amplitude of the signal represents the sine or the cosine with the phase of the signal with respect to an AC reference input on line 21 representing the sign of the output. These two outputs are provided to the stator windings of a resolver 23. The rotor of the resolver senses an error which is then demodulated to a DC voltage in a demodulator 25, amplified by an amplifier 27 to provide a DC output to drive a motor 29. The motor 29 will drive resolver 23 until the error signal is nulled. At this point the shaft 31 connecting the motor-resolver and output device will be at the desired angle.

FIG. 1A is a representation of the resolver 23. In the stator of the resolver is a sine winding 33 and orthogonal thereto a cosine winding 35. The rotor will have mounted on it another pair of orthogonal windings 37 and 39, one of which will provide the output of the error signal. Assume that the magnitude and the direction of the sine and cosine are as shown on FIG. 1B. The resultant magnetic field will be along the vector 41. With winding 39 in a position shown, the magnetic field will cut the coils of the winding and induce an error voltage which will cause motor 29 of FIG. 1 to rotate. The motor will rotate the rotor until the coils 39 are aligned with the vector 41 at which point a 0 voltage will be induced. It can be seen from an examination of FIGS. 1A and 1B that the absolute magnitude of the sine and cosine are not particularly significant. What is important is the ratio between sine and cosine, i.e., the tangent represented by the vector 41. As long as the relative magnitude of the sine and cosine provide a tangent which represents the angle Theta, a proper output will result. For example, assume Theta is 45°. Normally the sine output should be 0.707 and the cosine output 0.707. This will result, when the sine is divided by the cosine, in a tangent equal to one. But, if instead the sine output is 0.5, as long as the cosine output is also 0.5, the tangent, i.e., the vector 41 will still be in the same direction and the proper result will be obtained. It will be recognized that this is only a case where the scaling of the sine and cosine has been changed and as long as the scaling of both of them is equal the correct tangent will result. Even if in representing two different angles the scaling used is different, as long as the same scaling is used for both sine and cosine the correct tangent output will be obtained. For example, in the case above, a scaling of 0.5 over 0.707 or approximately 7/10 was used. If, for example, when providing an output to represent the angle 30° where the sign should be 0.5 and the cosine 0.866, a scaling of 0.8 is used, or outputs of 0.4 and 6.9 the proper tangent will still result since the same scale factor has been used for both sine and cosine. It is the nature of this relationship which permits using the simplified conversion scheme to be described below. The absolute values of the sine and cosine output by the digital to synchro converter will not always correspond to the normal sine and cosine values. However, in all cases when the sine is divided by the cosine the resulting tangent will be within the required degree of accuracy.

Figure 2:
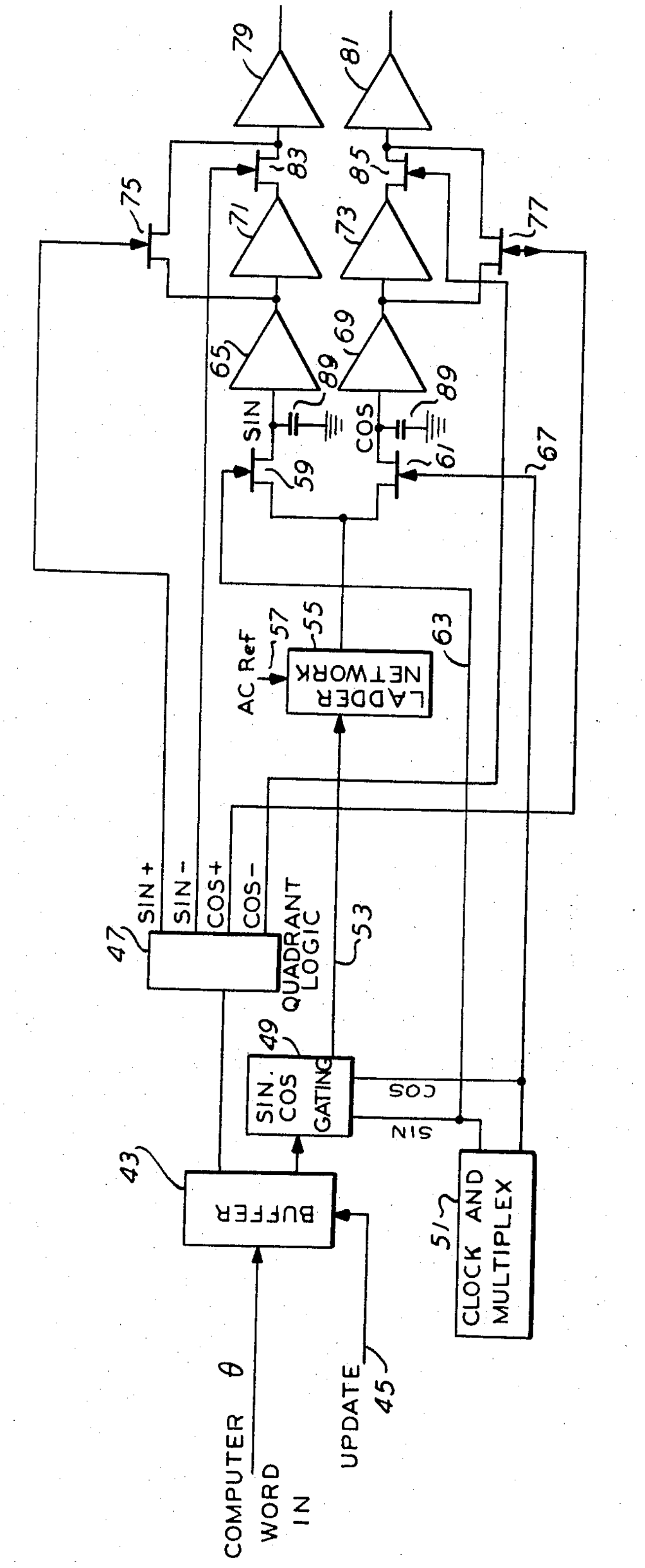
FIG. 2 is a block-circuit diagram of the preferred embodiment of the digital to synchro converter of the present invention.

FIG. 2 is a block-circuit diagram showing the basic operation of the converter of the present invention. A computer word representing the angle Theta is provided to a buffer 43. An update command on line 45 periodically causes the word from the computer to be loaded into buffer 43. The buffer provides some of its outputs, as will be seen below, to quadrant logic 47, where this is decoded to provide four outputs representing respectively sine positive, sine negative, cosine positive and cosine negative. The remainder of the bits of the buffer are provided to a sine-cosine gating module 49 which alternately, in response to inputs from a clock and multiplexer circuit 51, provides a digital output representing either the sine or the cosine on line 53. The input to buffer 43, the output from buffer 43 to the to the sine-cosine gating 49, and the output of gating 49 although shown as a single line will each comprise a plurality of lines each corresponding to one bit of the computer word input. The output on line 53 is provided to a ladder network 55 which has as another input the AC reference signal on line 57. In the ladder network the digital word will be converted to an AC signal which is amplitude modulated to represent the input on line 53. The output from ladder network 55 is provided to two FET switches 59 and 61, which have as their gate or switching input outputs from clock and multiplexer 51. If the output on line 53 represents the sine of the angle, switch 59 will be closed by an input on line 63 to permit the output of ladder network 55 to enter amplifier 65. If the output on line 53 represents the cosine, then an output on line 67 will open switch 61 to allow the output of ladder network 55 to go into amplifier 69. The output of amplifier 65 is provided to a unity gain invertng amplifier 71 and the output of amplifier 69 to a unity gain inverting amplifier 73. Thus, the output of amplifier 65 will represent a positive sine and the output from amplifier 71 a negative sine. Likewise, the output of amplifier 69 will represent the positive cosine and the output of amplifier 73 the negative cosine. Depending on the quadrant in which the angle is located, block 47 will provide two of the four outputs shown. Thus, for example, if the angle is in the first quadrant indicating a positive sine and positive cosine, outputs on those respective lines will be provided to switches 75 and 77 causing the outputs of amplifiers 65 and 69 to be switched respectively to amplifiers 79 and 81, the final output of the converter. In the third quadrant where both sine and cosine are negative, those respective outputs will cause switches 83 and 85 to respectively switch the outputs of amplifiers 71 and 73 to amplifiers 79 and 81. In quadrants 2 and 4, the proper combination of sine and cosine will similarly switch the outputs of the amplifiers 65 and 71 and 69 and 73 to amplifiers 79 and 81. Since the signals are multiplexed, a capacitor 89 is provided at the inputs to both amplifiers 65 and 69. This will essentially filter and smooth the outputs from the switches 59 and 61 to provide a smooth output from the system.

Figure 3:
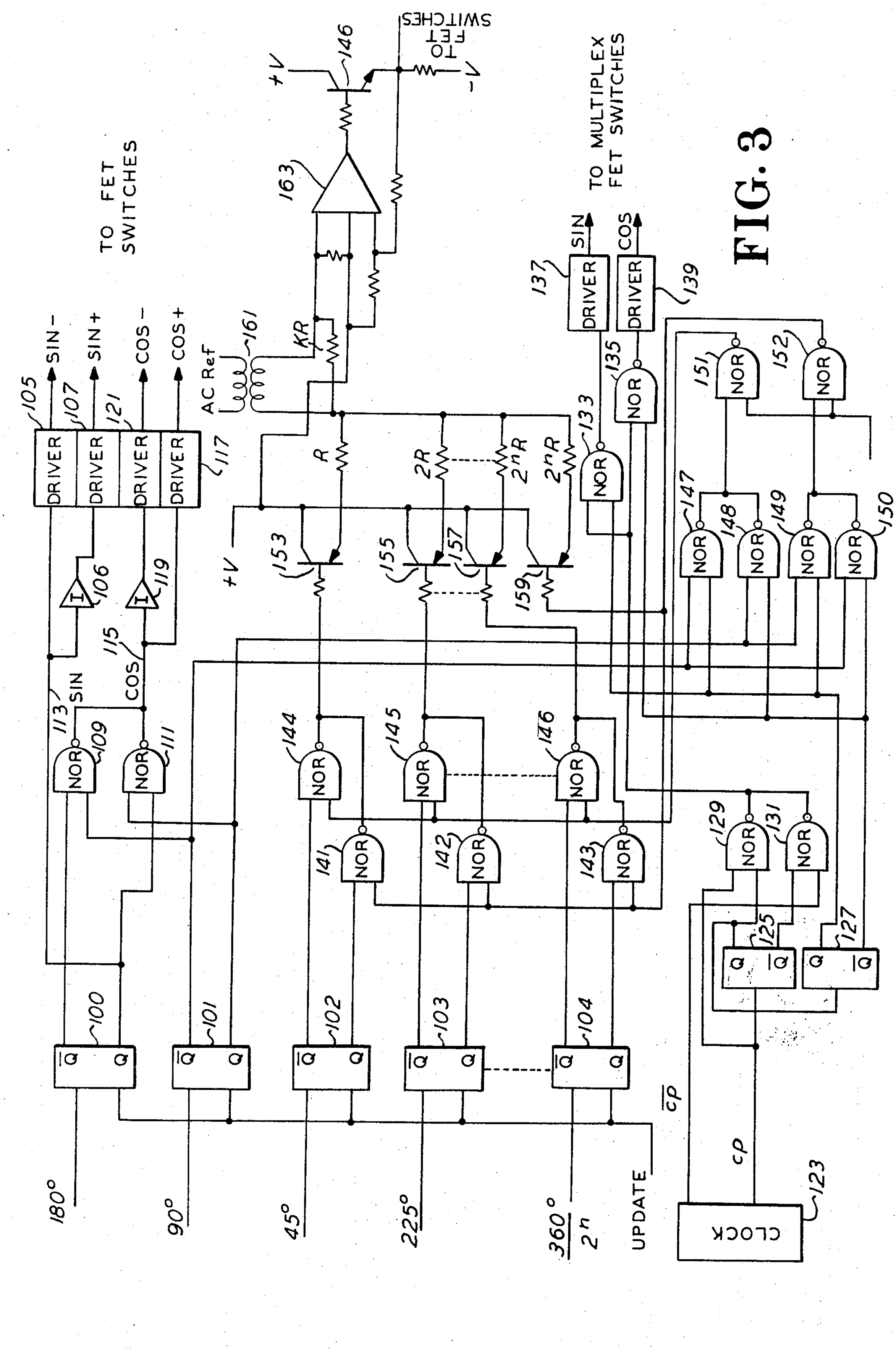
FIG. 3 is a circuit-logic diagram of a portion of the embodiment of FIG. 2.
Figure 4:
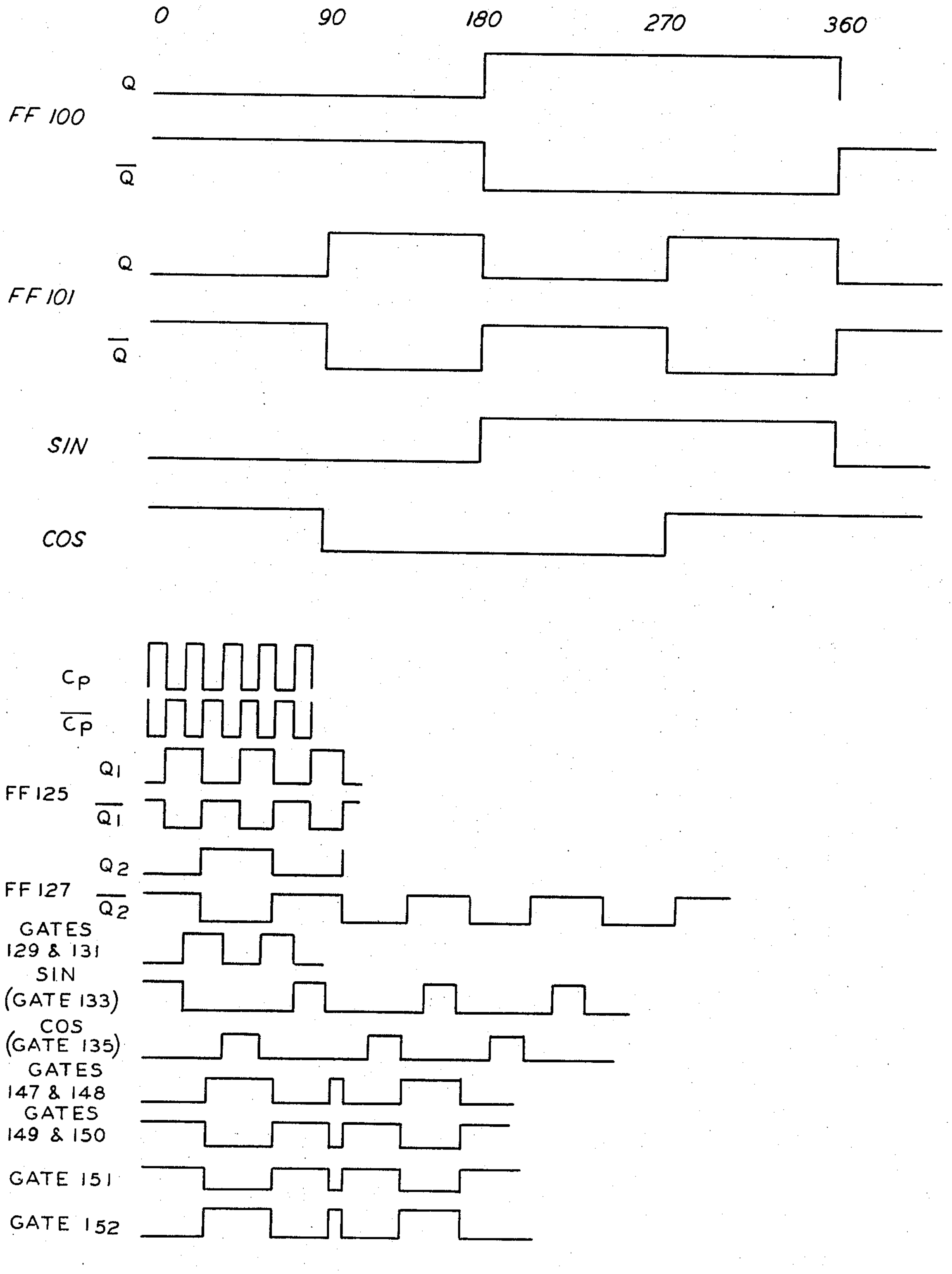
FIG. 4 is a waveform diagram showing the outputs of various logic elements in FIG. 3.

The circuits and logic of blocks 43, 49, 51 and 47 and 55 of FIG. 2 are shown on FIG. 3. The digital word input is provided to a plurality of flip-flops 100 through 104. In actuality, a greater number of flip-flops will normally be provided depending on the desired resolution. However, for purposes of this disclosure the ones shown will be sufficient. The most significant bit is provided to flip-flop 100, the next most significant to flip-flop 101 and so on with the least significant bit being supplied to flip-flop 104. The most significant bit will have a value of 180°, the next one 90°, the next 45° and so on, with the least significant bit having a value of 360° divided by $2^N$, where n is the number of bits in the digital word. An update command is provided from an external source such as the computer to cause whatever value is on the input lines to be loaded into the flip-flops 100 through 104 periodically. The outputs of flip-flops 100 and 101 are decoded to provide the quadrant signals required to switch FETs 75, 77, 83 and 85 of FIG. 2. Used in this decoding and used throughout the rest of the logic are Nor gates. A Nor gate has the characteristic that it will have a low output when any or all of its inputs are high and a high output only when all of its inputs are low. The 180° bit is used directly to provide an indication of the sign of the sine since in the first two quadrants, i.e., from 0° to 180°, the sine will be positive and in the third and fourth quadrants will be negative. When a 180° bit is loaded into flip-flop 100, indicating an angle in the third or fourth quadrants, it will have a high output on its Q output. This is provided to a driver 105 which will convert this logic level to a proper signal to drive the FET or 83 FIG. 2 to provide a negative sine output. It is also provided to an inverter 106. With the 180° bit high the inverter will provide a 0 output to another driver 107 which provides the sign plus output. However, when the 180° bit is not present, indicating a positive sine in the first or second quadrant, the low output from the Q output of flip-flop 100 will become a high output at inverter 106 and an output from driver 107 will be provided to FET 75 of FIG. 2. To determine the sign of the cosine, Nor gates 109 and 111 are used. Nor gate 109 has as its inputs the $\overline{Q}$ outputs of flip-flop 100 and 101. Nor gate 111 has as its inputs the Q outputs of flip-flops 100 and 101. The outputs of gate 109 and 111 are tied together. Thus, their combined output will be high whenever neither $\overline{Q}$ of flip-flop 100 and $\overline{Q}$ of flip-flop 101 are not present or Q of flip-flop 100 and Q of flip-flop 101 are not present. Essentially, this means that an output will be present whenever the outputs of both flip-flops are 1 or are 0. This is better illustrated by FIG. 4. The first two waveform diagrams show the corresponding Q and $\overline{Q}$ outputs of flip-flop 100 for various angles. The second two waveforms show the corresponding Q and $\overline{Q}$ outputs for flip-flop 101. Next are shown the sine and cosine outputs provided respectively on lines 113 and 115 of FIG. 3. The sine waveform is exactly the same as the Q waveform of flip-flop 100 from which it is taken. From 0° to 90° both flip-flop 100 and flip-flop 101 will have a low Q output and thus the output of gate 111 will be high as shown by the cosine waveform. When 90° is reached, the Q output of flip-flop 101 will go high, but Q output of flip-flop 100 will remain low and thus neither gate 109 nor 111 will have an output. Similarly, between 180° and 270° no output will result. However, between 270° and 360° both the $\overline{Q}$ output of flip-flop 100 and the $\overline{Q}$ output of flip-flop 101 will be low causing gate 109 to have an output. Thus, the cosine output will be high during the first and fourth quadrants. These are the quadrants in which the cosine is positive. This output is provided to a driver 117 which provides the cosine positive output and to an inverter 119 which provides the input to the minus cosine driver 121. Operation of these drivers is similar to that of drivers 105 and 107 described above. Thus, the two most significant bits are decoded to provide four outputs which will switch the proper FET switches shown on FIG. 2.

Since the ladder network is shared by both the sine and cosine, means to multiplex the sine and cosine outputs must be provided. Multiplexing is controlled by a clock 123 which provides two outputs, one labeled CP and the other $\overline{CP}$. These are also shown on FIG. 4. The clock pulse CP is provided to a flip-flop 125 which divides it by 2. The Q output of flip-flop 125 is provided to flip-flop 127 to accomplish another division by 2 or a division of the clock pulse by 4. The resulting waveforms at the outputs of flip-flops 125 and 127 are shown on FIG. 4. The Q output of flip-flop 125 is provided to a Nor gate 129 and the $\overline{Q}$ output to a Nor gate 131. Nor gate 129 has as its second input the clock pulse CP and Nor gate 131 has as its second input the clock pulse $\overline{CP}$. The outputs of gates 129 and 131 are tied together. The resulting output of the pair of gates 129 and 121 is as shown on FIG. 4. The pulses will be at the same rate as the pulse outputs of flip-flop 125, but will be shifted 90° from that pulse train. The combined output of gates 129 and 131 is provided as a first input to two more Nor gates 133 and 135, which provide the signals to the multiplexing FET switches 59 and 61 of FIG. 2. Gate 133 has as its second input the Q output of flip-flop 127 and gate 135 has as its second input the $\overline{Q}$ output of gate 127. The respective outputs of gates 133 and 135, which are the sine and cosine switching commands respectively, are also shown on FIG. 4. The pulse rate is one-half that from the output of gates 129 and 131, but the pulse width is equal to that of the gate output. The pulses on each of the two outputs occur sequentially. It will be noted that there is a time period equal to one pulse width between the occurrence of a pulse on one pulse train and that on another. This allows time for the ladder network to complete its conversion and settle out before the signal is switched into amplifier 65 or 69 of FIG. 2. The capacitors 89 provide means to store the signal in between switching cycles. The outputs of gates 133 and 135 are provided to respective drivers 137 and 139 which convert the logic levels to a voltage to drive the FET switches.

The outputs of flip-flops 102, 103 and 104 are switched to the ladder network with one of the outputs, i.e., Q or $\overline{Q}$ being switched for the sine $\theta$ and the other being switched for the cosine by gates 141 through 146. The switching commands which are provided to the FETs from gates 133 and 135 cannot be used for switching these gates for two reasons. First, as mentioned above, it is desirable that the ladder network have time to settle before the output is switched to the amplifier of FIG. 2. Secondly, the outputs which represent the sine. e.g., the Q outputs and those that represent the cosine, e.g. the $\overline{Q}$ outputs are not the same in all quadrants. This can be seen by an examination of FIG. 4A. Shown thereon are four angles 30°, 1200°, 210° and 300°. For each of these four angles the outputs of flip-flops 102, 103 and 104 will be the same. That is, when the 90° bit is subtracted from 120° the remainder is 30°, similarly, when 180° is subtracted from 210° and when 270° is subtracted from 300°, 30° results. Thus, as far as flip-flops 102, 103 and 104 are concerned each of these angles will appear as 30°. If the system finds the cosine and sine of 30° in each case, the answer will be correct in the first and third quadrants. However, in the second and fourth quadrants the answer will be incorrect. In effect, the sine and cosine will be reversed. However, it is quite evident that the only error will be that the values of the sine and cosine are reversed. That is to say, the cosine of 120° is the same as the cosine of 60° which is likewise the same as the sine of 30°. Thus, when in the second and fourth quadrants, i.e., when the Q bit of flip-flop 101 is high, the order of providing signals to the ladder network must be reversed.

The switching signals for gates 141 through 146 are provided by gates 147 through 152. Gates 147 and 150 have as inputs the $\overline{Q}$ output of flip-flop 101, the 90° flip-flop. Gates 148 and 149 have as inputs the Q output of flip-flop 101. Gates 147 and 149 have as their second input the Q output of flip-flop 127 and Gates 148 and 150 have as their second input the $\overline{Q}$ output of flip-flop 127. Gates 147 and 148 have their outputs tied together and gates 149 and 150 have their outputs tied together. The resulting outputs are best seen by looking at FIG. 4. During the time when the 90° bit is not present, i.e., the Q output of flip-flop 101 is low and the Q output is high, the respective outputs of gates 147 and 148 and gates 149 and 150 will be the same as the Q and Q not outputs of flip-flop 127. Thus, the sine output of gate 133 will occur in the middle of the output of gates 149 and 150 and the cosine output of gate 135 will occur in the middle of the pulse output of gates 147 and 148. As shown on FIG. 4 when the 90° bit is present, i.e., the Q output of flip-flop 101 is high and the Q output low, the opposite occurs. That is, the sine output of gate 133 occurs in the middle of a pulse output from gates 147 and 148 and the cosine output of gate 135 occurs in the middle of a pulse output from gates 149 and 150. These outputs of gates 147 and 148 and gates 149 and 150 are then inverted by a pair of gates 151 and 152 which will normally have a low voltage on their second input. The outputs of gates 151 and 152 provide the switching inputs to gates 141 through 146. Gate 151 provides the inputs to gates 144 through 146 which have as their second input the $\overline{Q}$ output of flip-flops 102 through 104 and gate 152 provides the inputs to gates 141 through 143 which have as their second inputs the Q outputs of flip-flops 102 through 104.

The outputs of gates 141 and 144 are tied together and provide an input to the base of transistor 153. Similarly, the outputs of gates 142 and 145 are tied together and provide an input to the base of transistor 155. The outputs of gates 143 and 146 are also tied together and provide the input to the base of transistor 157. Each of the transistors 153 through 157 are biased at a positive voltage, for example, +2 volts DC. A digital 1 or high output from the corresponding gates will back bias the transistor and turn it off. A digital 0 or low voltage will cause the transistor to be turned on. A fourth transistor 159, which is used for cosine correction in a manner to be described below, is controlled in a similar manner directly by the output of gate 152. An AC reference signal is provided by one side of transformer 161 to a plurality of resistors R, 2R, $2^n$R and $2^n$R connected respectively to transistors 153, 155, 157 and 159. The other side of the reference is connected to one side of the input to an amplifier 163. The other side of each of the transistors is connected to the other input of amplifier 163. Switching the transistors on causes portions of the AC reference to be placed in the circuit as a function of the resistor values. This may be more clearly seen by reference to FIG. 5, a simplified schematic of this portion of the circuit. In this simplified schematic the transistor switches 153, 155, 157, and 159 are shown as ordinary switches. The voltage input to amplifier 163 will be equal to the voltage across resistor KR. Since the reference voltage $V_{in}$ is known and the value of the resistors are also known the current I in the loop can be found and that current multiplied by KR to obtain the voltage across KR. These equations would be as follows:

$$I_1 = \frac{Vin}{\dfrac{1}{\dfrac{1}{R}+\dfrac{1}{2R}+\dfrac{1}{2^nR}}+KR}$$

$$V_{KR} = \frac{KRV_{in}}{\dfrac{1}{\dfrac{1}{R}+\dfrac{1}{2R}+\dfrac{1}{2^nR}}+KR}$$

The table below sets out a relationship between the input angle Theta the value of $n$, the corresponding switch position and the value of the resistance at that switch position. In terms of $n$ it can be seen that the value of any resistor will be equal to $R\ 2^{n-1}$. Thus, the above equation can be written as follows:

| $\theta$ | $n$ | Switch | R |
|---|---|---|---|
| 45° | 1 | 153 | R |
| 22° | 2 | 155 | 2R |
| 11.5° | 3 | | 4R |
| . | . | | . |
| . | . | . | . |
| $45/2^{m-1}$ | $m$ | 157 | $2^{m-1}$R |

$$V_{KR} = \frac{KRV_{in}}{\dfrac{1}{\dfrac{1}{R}\times 2^{n-1}}}$$

ample, are used for providing the input, the complement will have a series of ones which goes out to infinity. Thus, if the complement is input $$\overline{1/2n} = 1/4 + 1/16 + 1/32 + \text{------}$$

to infinity, the sum of the bits through infinity is approximately equal to the least significant bit provided or in this case one-eighth. Thus, $$\overline{1/2n} = 1/4 = 1/8 = 3/8$$

This can be related to the equation for the normal input as follows: $\Sigma\ 1/2n = 1 - \Sigma\ \overline{1/2n}$ Complement Thus, in terms of $N$ the voltage $V_{KR}$ when the complement is input would be as follows:

$$V_{KR} = K_1\ (1 - N)/1 + K_1\ (1 - N)$$

This explains the need for the switch S159 or the transistor 159 and the second $2^{m-1}R$ resistor. If a voltage, which is a function of the complement of the input is to be provided, a correction is necessary which will approximate the sum of the remaining bits to infinity. As shown above, this approximation will equal the least significant bit.

Returning now to FIG. 3, assume that flip-flop 104 has as an input a bit representing 11.25°. As an example of the operation of the circuit, assume that the 45° bit and the 11.25° bit indicating an angle of 56.25° are provided as inputs to flip-flops 102, 103 and 104. Flip-flop 102 will have a Q output which is 1 or high and a $\overline{Q}$ output which is 0 or low. Flip-flop 103 will have a $\overline{Q}$ output which is high and a Q output which is low. Flip-flop 104 will have a low $\overline{Q}$ output and a high Q output. The table below sets out the corresponding outputs of the gates 141 through 146, the transistors 153 through 157 and the contribution of the resistors R, 2R, etc. of the above equations for the two conditions at the outputs of gates 151 and 152 as shown on FIG. 4.

| | Gates | | | | | | Transistor | | | | Resistors | | | |
|---|---|---|---|---|---|---|---|---|---|---|---|---|---|---|
| | 141 | 142 | 143 | 144 | 145 | 146 | 153 | 155 | 157 | 159 | R | 2R | 4R | 4R |
| Gate 151 High<br>Gate 152 Low | 0 | 1 | 0 | 0 | 0 | 0 | ON | OFF | ON | OFF | ½ | 0 | ⅛ | 0 |
| Gate 152 High<br>Gate 151 Low | 0 | 0 | 0 | 1 | 0 | 1 | OFF | ON | OFF | ON | 0 | ¼ | 0 | ⅛ |

where $n$ equals 1, 2, 3, - - - $m$ the bits present in the input word. In the above equation the $R$'s cancel and the equation becomes $V_{KR} = K\ (\ \Sigma\ 1/2\ n - 1)/1 + K\ \Sigma\ \overline{1/2n - 1}$ If $K$ is equal to $K\,\overline{1/2}$ then substituting $K1$ into the above equation $V_{KR} = K_1\ \overline{1/2}\ \overline{(\Sigma 1/2\ n - 1)/1} + \overline{K_1}\ \overline{1/2}\ \Sigma\ \overline{1/2n - 1}$ Let $N = \overline{\Sigma\ 1/2\ n}$ *or* $= K_1\ \Sigma\ 1/2n/1 + K_1\ \Sigma\ 1/2n\ VKR = \overline{K_1}\ \overline{N}/1 + K_1\ N$ For a bit pattern with bits 1 and 3 present, for example, $$\overline{1/2n} = \overline{1/2 + 1/8} = 5/8.$$

The table below shows this bit pattern and also the complement of the bit pattern.

| Bit ($n$) | 1 | 2 | 3 | 4 | 5 | 6 | ... | $m$ |
|---|---|---|---|---|---|---|---|---|
| Hot Comp | 1 | 0 | 1 | 0 | 0 | 0 | 0 | 0 |
| Complement | 0 | 1 | 0 | 1 | 1 | 1 | 1 | 1 |

It will be noted that even though only three bits, for ex-

When gate 151 has a high output and gate 152 has a low output, the outputs of gates 144 through 146 will all have at least one input high, i.e., the output from gate 151 and thus will all have 0 outputs. The gates 141 through 143 will all have one input low from gate 152. If any of them also have a low input on its other input, then it will provide a high output. This is true in the case of gate 142 which has a low output from the Q output of flip-flop 103. At transistors 153 through 157 the low outputs of gates 141 and 143 will cause transistors 153 and 157 to remain on. The high output of gate 142 will cut off transistor 153. The corresponding resistor contributions are 1/2, 0 and 1/8. When gate 152 goes high and gate 151 goes low, the high input to gates 141 through 143 will cause them to all remain at 0. Gates 144 and 146 will have a low input from the $\overline{Q}$ outputs of 102 and 104 respectively. This will cause their outputs to go high. Gate 145 will still have a high output from the $\overline{Q}$ output of flip-flop 103 and will remain low. At the transistors this will cause transistors 153 and 157 to be off and 153 to be on. The resistor contribution to the equation above will be one-quarter from the 2R resistor and one-eighth from the resistor associated with transistor 159 which will have been turned on by the low output of gate 151. Substituting into the above equations a value of $N$ = five-eighths and and N −1 = 3/8 and using a value for $K_1$ = to 0.54 (a constant which has been found to work well) the following equations for the two conditions of gates 151 and 152 described above results:

Cond 2 (cosine) $V_{KR} = .54\ (3/8)/1 + .54\ (3/8) = .168$

Cond 1 (sine) $V_K = .54\ (5/8)/1 + .54\ (5/8) = .252$

The first output, that is the output when the gates 151 and 152 were in condition 1, represents the sine and output voltage corresponding to the second condition the cosine. Obviously, these values are not equal to what we would normally consider the sine and cosine of 56.25°, however, if the sine is divided by the cosine, the tangent value comes out to approximately 1.5. This represents an angle of approximately 56.25°. Of course, the outputs can be multiplied by a constant to obtain the normal values associated with sine and cosine. However, the constant required to obtain this equality will vary for different digital word inputs. However, in each case the ratio of sine to cosine or the tangent will provide the correct answer within the required tolerance. The table below sets out the values which will be obtained for various angles and shows also the ratio of the actual value obtained from the equations to the proper value of the sine and cosine. From this it can be seen that if the output of amplifier 163 is made to be approximately three times its input, the values obtained therefrom will be close to the normal voltages associated with sine and cosine.

| Angle ($\theta$) | Sine | Cosine | Scale Factor |
|---|---|---|---|
| 11.25° | .0635 | .32 | 3.06 |
| 22.5° | .119 | .288 | 3.22 |
| 33.75° | .168 | .252 | 3.31 |
| 45.° | .212 | .212 | 3.32 |
| 56.25° | .252 | .168 | 3.31 |
| 78.75° | .32 | .0635 | 3.06 |

At this point, a review of the total operation of the converter would seem to be in order. A computer word is input to the flip-flops 100 through 104 with the most significant bit having a value of 180° and each bit, thereafter, a value of one-half of that of the bit before it. The Q outputs of the flip-flops will represent the digital word input and the Q outputs the complement of that digital word input. The first two flip-flops are used with gates 109 and 111 to provide outputs indicative of the sign of the sine and cosine which are provided to the switching FETS on FIG. 2 to switch either a positive or negative final output. The remaining flip-flop outputs are gated by gates 141 through 146, with the digital word and its complement being alternately provided to a ladder network. Control of whether the word or its complement are provided is controlled by flip-flops 125 and 127 and their associated gates. This section of the logic also is connected to the 90° output of flip-flop 102 so that for angles in the first and third quadrants the digital word is used in determining the sine value and the complement used for the cosine and in quadrants two and four the digital word is used to find the cosine and the complement to find the sine. The ladder network converts the digital input to a modulated AC analog output which is provided through amplifier 163 and an isolation stage 164 to FETs 59 and 61 of FIG. 2. Other logic associated with flip-flops 125 and 127 also provides outputs to the FETS 59 and 61 of FIG. 2 so that the output of amplifier 163 will be provided to the proper one of the cosine amplifier 69 or the sine amplifier 65. The outputs of the amplifiers 65 and 69 are then either provided directly to output amplifiers 79 and 81 through FETs 75 and 77, respectively, or first inverted through amplifiers 71 and 73 and then switched through FETs 83 and 85 to the amplifiers 79 and 81. Selection of which FETs are switched in to provide positive or negative outputs is controlled by the outputs of gates 109 or 111.

Thus, a simple digital to synchro converter which makes use of multiplexing techniques and a simple ladder network to perform the required conversion has been shown. Although a specific embodiment of the invention has been described and illustrated in the drawings it will be obvious to those skilled in the art that various modifications may be made without departing from the spirit of the invention which is intended to be limited solely by the appended claims.

We claim:

1. Digital to synchro conversion apparatus to convert an N bit digital word to analog sine and cosine signals comprising:

a. sine signal output menas;

b. cosine signal output means;

c. a source of reference voltage;

d. a resistor having a value KR;

e. a resistor ladder network comprising N−1 resistors having the valves R, 2R - - - $2^{(N-3)}$ R and $2^{(N-3)}$ R and N−1 normally open switches, which close in response to a switching input, in series with respective ones of said resistors forming N−1 switched paths said switched paths being connected in parallel and the parallel combination being connected in series with said resistor KR and said source of reference voltage;

f. first coupling means to alternately couple the third through the Nth bits of the N bit digital word and its complement as switching inputs to respective ones of said switches associated with the resistors R through the first $2^{(N-3)}$ R and to provide a further switching input to the switch associated with the second $2^{(N-3)}$ R resistor when said complement is being coupled:

g. second coupling means synchronized with said first coupling means to couple the voltage across said resistor KR to said sine output means when said digital word is coupled to said ladder network and to couple the voltage across said resistor KR to said cosine output means when said complement is coupled to said ladder network, whereby, by using a common ladder network to compute both sine and cosine, inaccuracies in both the sine and cosine and will tend to cancel when the output is used in a tangent responsive device;

wherein each of said sine and cosine output means include means to store the last coupled value from said resistor KR while the output of said resistor KR is being provided to the other of said sine and cosine output means and wherein said second coupling means is operable to begin coupling said resistor KR to one of said sine and cosine output means a predetermined time after corresponding operation of said first coupling means and to cease coupling a predetermined time before corresponding operation of said first coupling means.

2. The invention according to claim 1 and further including:

a. means to decode the first two bits of said digital word to provide outputs indicative of the signs of said sine and cosine; and b. means included in said sine and cosine output means responsive to said decoder output to accordingly provide positive and negative outputs.

3. The invention according to claim 2 wherein each of said sine and cosine output means comprise at least means to invert the output coupled from said resistor KR and means to supply, as an output, said signal from said resistor KR in response to a positive indication from said decoding means and the output of said inverting means in response to a negative indication from said decoding means.

4. The invention according to claim 3 wherein said decoding means provides first, second, third and fourth outputs corresponding, respectively, to positive sine, negative sine, positive cosine, and negative cosine and each of said sine and cosine output means comprise:

a. a first non-inverting amplifier obtaining its input from said second coupling means;

b. an inverting amplifier having as an input the output of said first non-inverting amplifier;

c. a second non-inverting amplifier providing its output as the final output of said output means;

d. a first switch responsive to a respective one of said first and third decoder outputs coupling the output of said first non-inverting amplifier to said second non-inverting amplifier;

e. a second switch responsive to a respective one of said second and third decoder output coupling the output of said inverting amplifier to said second non-inverting amplifier; and f. a storage capacitor at the input of said first non-inverting amplifier.

5. Digital to synchro conversion apparatus comprising:

a. means to store an N bit digital word representing an angle between 0 and 360°, said means having a first set of outputs representing said word and a second set of outputs representing the complement of said word;

b. means providing a first and a second pulse train having pulses thereon in alternate time periods;

c. a plurality of N-1 switches each having an input terminal, an output terminal and a switching terminal said switches connecting said input terminal to said output terminal in response to a signal on said switching terminal, the N-1th switch having its switching terminal coupled to said second pulse train;

d. gating means coupling the third through the Nth bits of said first set of outputs to the switching terminals of the first N-2 of said N-1 switches in response to a pulse on said first pulse train and coupling the third through the Nth bits of said second set of outputs to the switching terminals of said first N-2 switches in response to a pulse on said second pulse train;

e. a resistor KR;

f. a resistor ladder network of N-1 resistors having values R, 2R - - - $2^{(N-3)}$ R $2^{(N-3)}$R and each having one side coupled to the respective one of said N-1 switches, the first switch coupled to the resistor R, the second to the resistor 2R and so on with the N-1 switch coupled to the second resistor $2^{(N-3)}$R, the other side of each of said resistors connected together and to one side of said resistor KR;

g. an AC reference source having one side coupled to the input terminal of each of said N-1 switches and the other side to the other side of said resistor KR;

h. means to decode the first two bits of said first and second sets of outputs to provide a signal on a first output line when the sine of the stored angle is positive, a signal on a second output line when said sine is negative, a signal on a third output line when the cosine is positive and a signal on a fourth output line when the cosine is negative;

i. a first non-inverting amplifier;

j. a first inverting amplifier having its input coupled to the output of said first non-inverting amplifier;

k. a second non-inverting amplifier:

l. a second inverting amplifier having its input coupled to the output of said second non-inverting amplifier;

m. a third non-inverting amplifier;

n. a fourth non-inverting amplifier;

o. a first switch coupling the voltage across said resistor KR to said first non-inverting amplifier in response to a pulse on said first pulse train;

p. a second switch coupling the voltage across said resistor KR to said second non-inverting amplifier in response to a pulse on said second pulse train;

q. a third switch coupling the output of said first non-inverting amplifier to said third non-inverting amplifier in response to a signal on the first output line of said decoding means;

r. a fourth switch coupling the output of said first inverting amplifier to said third non-inverting amplifier in response to a signal on the second output line of said decoding means;

s. a fifth switch coupling the output of said second non-inverting amplifier to said fourth non-inverting amplifier in response to a signal on the third output line of said decoding means; and t. a sixth switch coupling the output of said second non-inverting amplifier to said fourth non-inverting amplifier in response to a signal on the fourth output line of said decoding means.

6. The invention according to claim 5 and further including a buffer amplifier interposed between said resistor KR and said first and second switches.

7. The invention according to claim 5 wherein said first, second, third, fourth, fifth, and sixth switches are FET switches.

8. The invention according to claim 5 and further including first and second storage capacitors at the inputs of said first and second non-inverting amplifiers.

9. The invention according to claim 5 wherein said means to generate said first and second pulse trains generates third and fourth pulse trains, the pulses on said third pulse train being shorter than and occuring in the middle of a pulse on said first pulse train and the pulses on said fourth pulse train being shorter than and occuring in the middle of a pulse on said second pulse train, said first and second pulse trains being provided to said gating means and said N-1th switch and said third and fourth pulse trains being provided, respectively, to said first and second switches.

10. The invention according to claim 9 wherein said first, second, third and fourth pulse trains and the first, second, third, and fourth outputs of said decoding means are at logic levels and further including drivers interposed between each of said third and fourth pulse trains, said first, second, third, and fourth decoder outputs and said respective first, second, third, fourth, fifth, and sixth FET switches.

11. The invention according to claim 10 wherein said storage means comprise N flip-flops each havng at least a data input and an update input whereby the word stored therein may be periodically updated.

* * * * *